United States Patent [19]

Chen et al.

[11] Patent Number: 6,043,147
[45] Date of Patent: Mar. 28, 2000

[54] METHOD OF PREVENTION OF DEGRADATION OF LOW DIELECTRIC CONSTANT GAP-FILL MATERIAL

[75] Inventors: Robert C. Chen, Los Altos; Jeffrey A. Shields, Sunnyvale, both of Calif.; Robert Dawson, Austin, Tex.; Khanh Tran, San Jose, Calif.

[73] Assignee: Advanced Micro Devices, Inc., Sunnyvale, Calif.

[21] Appl. No.: 08/993,119

[22] Filed: Dec. 18, 1997

[51] Int. Cl.[7] .................................................. H01L 21/316
[52] U.S. Cl. ........................................... 438/624; 438/790
[58] Field of Search .................................. 438/404, 623, 438/624, 631, 760, 763, 778, 781, 782, 795, 790

[56] References Cited

U.S. PATENT DOCUMENTS

| | | | |
|---|---|---|---|
| 5,549,934 | 8/1996 | Garza et al. | 427/489 |
| 5,750,403 | 5/1998 | Inoue et al. | 438/787 |
| 5,818,111 | 10/1998 | Jeng et al. | 438/631 |
| 5,888,911 | 3/1999 | Ngo et al. | 438/788 |

*Primary Examiner*—Olik Chaudhuri
*Assistant Examiner*—Anh Duy Mai

[57] ABSTRACT

Patterned metal layers are gap filled with HSQ and passivated to stabilize the dielectric constant of the HSQ substantially at the as-deposited value prior to oxide deposition by PECVD and planarization. Passivation and stabilization are effected by treating the as—deposited HSQ layer in a silane ($SiH_4$) containing plasma.

19 Claims, 1 Drawing Sheet

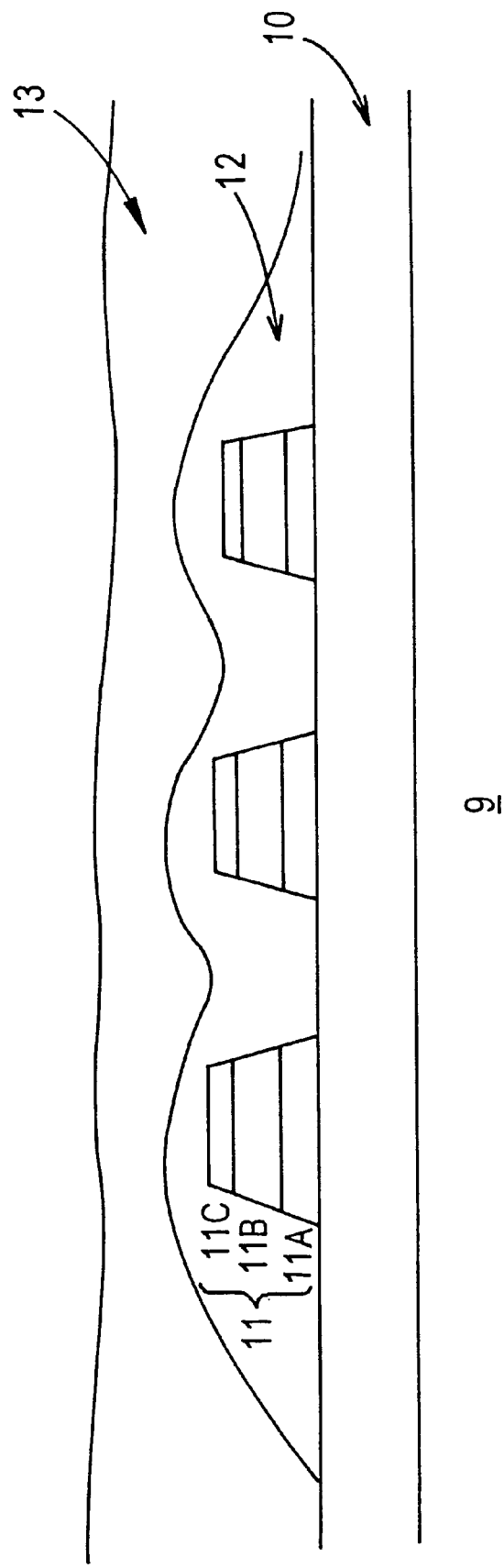

METHOD OF PREVENTION OF DEGRADATION OF LOW DIELECTRIC CONSTANT GAP-FILL MATERIAL

TECHNICAL FIELD

The present invention relates to a method of manufacturing a multi-metal layer semiconductor device with reliable interconnection patterns having a low RC time constant. The invention has particular applicability in manufacturing high density multi-metal layer semiconductor devices with design features of 0.25 micron and under.

BACKGROUND ART

The escalating requirements for high densification and performance associated with ultra large scale integration semiconductor devices require design features of 0.25 micron and under, such as 0.18 micron, increased transistor and circuit speeds, high reliability and increased manufacturing throughput. The reduction of design features to 0.25 micron and under generates numerous problems challenging the limitations of conventional interconnection technology, including conventional photolithographic, etching, and deposition techniques.

Conventional methodology for forming patterned metal layers comprises a subtractive etching or etch back step as the primary metal patterning technique. Such a method involves the formation of a first dielectric interlayer on a semiconductor substrate, typically monocrystalline silicon, with conductive contacts formed therein for electrical connection with an active region on the semiconductor substrate, such as a source/drain region. A metal layer, such as aluminum or an aluminum alloy, is deposited on the first dielectric layer, and a photoresist mask is formed on the metal layer having a pattern corresponding to a desired conductive pattern. The metal layer is then etched through the photoresist mask to form the conductive pattern comprising metal features separated by gaps, such as a plurality of metal lines with interwiring spacings therebetween. A dielectric material, such as spin on glass (SOG), is typically deposited to fill in the gaps between the metal features, and baked at a temperature of about 300° C. to about 450° C., for a period of time up to about two hours, depending upon the particular SOG material employed. Planarization, as by chemical-mechanical processing (CMP), is then performed.

The drive to achieve increased density and attendant shrinkage in feature size generates numerous problems. For example, as feature sizes, e.g., metal lines and interwiring spacings, shrink to 0.25 micron and below, such as 0.18 micron, it becomes increasingly difficult to satisfactorily fill in the interwiring spacings voidlessly with a dielectric material and obtain adequate step coverage. It also becomes increasingly difficult to form a reliable interconnection structure. A through-hole is typically formed in a dielectric layer to expose an underlying metal feature, wherein the metal feature serves as a landing pad occupying the entire bottom of the through-hole. Upon filling the through-hole with conductive material, such as a metal plug to form a conductive via, the entire bottom surface of the conductive via is in direct contact with the metal feature.

Another problem generated by miniaturization relates to the RC time constant. Although semiconductor devices are being scaled in the horizontal dimension, they are not generally scaled in the vertical dimension, since scaling in both dimensions would lead to a higher current density that could exceed reliability limits. Horizontal scaling, therefore, requires conductive lines having a high aspect ratio, i.e., conductor height to conductor width of greater than one, e.g., three or four with reduced interwiring spacings. As a result, capacitive coupling between conductive lines becomes a primary limitation on circuit speed. If intrametal capacitance is high, electrical inefficiencies and inaccuracies increase. It is recognized that a reduction in capacitance within multi-level metallization systems will reduce the RC time constant between the conductive lines.

Hydrogen silsesquioxane (HSQ) offers many advantages for use in interconnect technology. HSQ is relatively carbon free, thereby rendering it unnecessary to etch back HSQ below the upper surface of the metal lines to avoid poisoned via problems. In addition, HSQ exhibits excellent planarity and is capable of gap filling interwiring spacings less than 0.15 micron employing conventional spin-on equipment. HSQ undergoes a melting phase at approximately 200° C.; it does not convert to the high dielectric constant glass phase until reaching temperatures of about 400° C. in intermetal applications. As—deposited HSQ is considered a relatively low dielectric constant material with a dielectric constant of about 2.8–3.2, vis-à-vis silicon dioxide grown by a thermal oxidation or chemical vapor deposition which has a dielectric constant of about 3.9–4.2. The mentioned dielectric constants are based on a scale wherein 1.0 represents the dielectric constant of air.

However, in attempting to apply HSQ to interconnect technology, particularly for gap filling, it was found that its dielectric constant became undesirably high as a result of subsequent processing. For example, a layer of HSQ was initially deposited on a patterned metal layer to fill in gaps between metal features. Subsequently, an oxide layer was deposited and planarized. Such an oxide layer included silicon dioxide derived from tetraethyl orthosilicate (TEOS) deposited by plasma enhanced chemical vapor deposition (PECVD) in an oxygen-containing atmosphere at about 400° C. Another such oxide layer is silicon dioxide derived from silane deposited by PECVD in an $N_2O$-containing atmosphere, at about 400° C. It was found that after such depositions of silicon dioxide by PECVD, the dielectric constant of the deposited HSQ layer undesirably increased from about 2.8–3.2 to as high as about 4.0. This rise in dielectric constant is believed to result from the oxidation of the top surface of the HSQ due to exposure to an oxygen-containing ambient at an elevated temperature. The undesirable increase in the dielectric constant of the HSQ layer adversely impacts the intrametal capacitance and, therefore, circuit speed.

Accordingly, there exists a need for methodology enabling the use of HSQ as a dielectric material in interconnect technology, particularly for gap filling a patterned metal layer with subsequent deposition of an oxide and planarization, without adversely increasing the dielectric constant of the HSQ layer.

DISCLOSURE OF THE INVENTION

An object of the present invention is to provide a method of manufacturing a high density, multi-metal layer semiconductor device with design features of 0.25 micron and under, and an interconnection pattern comprising HSQ exhibiting a relatively low dielectric constant.

Additional objects, advantages and other features of the present invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a multilevel semiconductor device, which method comprises: forming a first dielectric interlayer on a substrate; forming a first patterned metal layer on the first dielectric interlayer, said patterned metal layer having gaps therein and comprising a first metal feature; depositing a layer of low dielectric constant material on said first patterned metal layer, thereby filling the gaps; treating the exposed upper surface of the layer of low dielectric constant material with a silane ($SiH_4$) containing plasma to passivate and stabilize said layer of low dielectric constant material, whereby the low dielectric constant is maintained substantially at its as-deposited value during subsequent device processing; and depositing an oxide layer over the plasma treated upper surface of the layer of low dielectric material.

A preferred material for use as the low dielectric constant layer is hydrogen silsesquioxane (HSQ).

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

FIG. 1 schematically illustrates an embodiment of the present invention.

DESCRIPTION OF THE INVENTION

The present invention enables the use of various low dielectric constant materials, such as HSQ, for gap filling patterned metal layers in forming highly reliable interconnections, while avoiding an undesirable increase in the dielectric constant of the deposited gap-filling layer due to subsequent processing, including PECVD of silicon dioxide. The mechanism responsible for an increase in the dielectric constant of the deposited material, such as HSQ, as a result of such subsequent processing is not known with certainty. However, it is believed that at least some increase in the dielectric constant of HSQ is caused by oxidation during PECVD deposition, thereby reducing the number of Si—H bonds generating Si—OH bonds and moisture. It is believed that the amount of Silicon (Si) in the as-deposited HSQ is at least 90 atomic %, whereas, after oxide deposition the amount of Si is reduced to about 30 to about 40 atomic %, with an attendant increase in the dielectric constant. This leads to a degradation in dielectric constant.

In accordance with the present invention, HSQ is deposited in a thickness of about 3,500 Å to about 5,000 Å, preferably about 4,000 Å, to gap fill a patterned metal layer, as by employing conventional spin on equipment. Prior to oxide deposition over the HSQ gap fill layer, the gap fill layer is subjected to a passivation treatment. In an embodiment of the present invention, the deposited HSQ gap fill layer is passivated by exposing the surface thereof to a silane ($SiH_4$)—containing plasma, whereby the dielectric constant of the deposited HSQ gap fill layer is stabilized at its as—deposited value, which value is maintained substantially constant during further device processing, including exposure to oxidizing environments at elevated temperatures. An oxide layer, such as of silicon dioxide, is deposited on the passivated HSQ layer, as by PECVD in an oxidizing environment at a temperature of about 400° C. For example, after deposition and plasma passivation treatment of the HSQ gap fill layer, silicon dioxide derived from TEOS is deposited by PECVD in an oxygen-containing atmosphere followed by planarization, e.g., chemical-mechanical-polishing. In another embodiment, silicon dioxide derived from silane is deposited by PECVD in an atmosphere containing $N_2O$ at about 400° C. and planarized. As part of the PECVD of the oxide process, the wafer containing the deposited HSQ is heat soaked, i.e., acclimated by heating to a temperature proximate the PECVD temperature in an oxidizing environment. When depositing silicon dioxide derived from TEOS, heat soaking is conducted in an oxygen-containing environment; whereas, if the deposited oxide is derived from silane, heat soaking is conducted in an atmosphere containing $N_2O$.

The dielectric constant of an as-deposited HSQ layer undesirably increases from about 2.8–3.2 to as high as about 4.0 as a result of subsequent processing, e.g. oxide deposition thereon. In accordance with an embodiment of the present invention, the HSQ gap fill layer is subjected to a passivation treatment with a silane containing plasma prior to oxide deposition thereon, whereby the as-deposited dielectric constant is stabilized, i.e., the as-deposited dielectric constant is substantially maintained during subsequent processing. In the absence of the inventive plasma treatment, the dielectric constant of the HSQ would incrrease to as high as about 4.0 after subsequent processing. Given the objectives and guidance of the present disclosure, the plasma treating conditions can be readily optimized in a particular situation.

Thus, the present invention enables the use of low dielectric constant materials, such as HSQ, for gap filling patterned metal layers while avoiding an undesirable increase in its dielectric constant upon subsequent processing, such as oxide deposition. The present invention can be employed in various phases of semiconductor manufacturing wherein HSQ is employed, particularly in gap filling patterned metal layers.

An embodiment of the present invention is schematically illustrated in FIG. 1, wherein a patterned metal layer comprising metal feature 11 is formed on dielectric interlayer 10 formed over semiconductor wafer substrate 9 comprising at least one active region therein. Embodiments of the present invention include forming a composite patterned metal layer comprising an initial titanium or tungsten layer 11A, an intermediate layer 11B comprising aluminum or an aluminum alloy, and an upper anti-reflective coating 11C, such as of titanium-titanium nitride. Gaps between metal features of the patterned metal layer are filled with HSQ 12. The surface of the deposited HSQ gap fill layer is then passivated by treatment with a $SiH_4$-containing plasma to stabilize the dielectric constant at substantially its as-deposited value. An oxide layer 13 is then deposited on HSQ layer 12 without encountering any meaningful increase in the dielectric constant of the as-deposited HSQ gap fill layer.

The present invention is advantageously applicable to the formation of conventional vias wherein the bottom of the via is fully enclosed by the underlying metal feature, as well as the formation of borderless vias wherein the via is in contact with a portion of the upper surface and a side surface of the underlying metal feature.

The method of the invention advantageously provides passivation and stabilization of the dielectric constant of low dielectric constant materials, such as HSQ, thereby avoiding an undesirable increase in its dielectric constant during subsequent processing, e.g., deposition of a silicon dioxide layer 13 derived from TEOS and $O_2$ or from silane and $N_2O$ by plasma enhanced chemical vapor deposition (PECVD). The exact nature of the passivation and dielectric constant stabilization mechanism(s) involved are not known. However, regardless of the involved mechanism(s), the $SiH_4$ plasma treatment effects passivation by stabilizing the low as deposited dielectric constant prior to silicon oxide deposition thereon, thereby avoiding an undesirable increase in the dielectric constant of the low dielectric material, such as a HSQ layer.

The present invention is applicable to the production of various types of semiconductor devices, particularly those containing high density, multi-metal patterned layers with submicron features, particularly submicron features of about 0.25 micron and below, exhibiting high speed characteristics and improved reliability. The present invention enables the advantageous use of low dielectric materials, particularly HSQ, to gap fill patterned metal layers without an undesirable increase in its as-deposited dielectric constant by stabilizing the dielectric constant thereof at its as-deposited value, prior to subsequent processing, such as PECVD of an oxide layer thereon. The present invention is cost effective and can easily be integrated into conventional processing equipment.

In carrying out the embodiments of the present invention, the metal layers can be formed of any metal typically employed in manufacturing semiconductor devices, such as aluminum, aluminum alloys, copper, copper alloys, gold, gold alloys, silver, silver alloys, refractory metals, refractory metal alloys, and refractory metal compounds. The metal layers of the present invention can be formed by any technique conventionally employed in the manufacture of semiconductor devices. For example, the metal layers can be formed by conventional metallization techniques, such as various types of CVD processes, including low pressure chemical vapor deposition (LPCVD), and PECVD. Normally, when high melting metal point metals such as tungsten are deposited, CVD techniques are employed. Low melting point metals, such as aluminum and aluminum-base alloys, including aluminum-copper alloys, can also be deposited by evaporation, sputtering, or physical vapor deposition (PVD).

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a multilevel semiconductor device, which method comprises:

forming a first dielectric interlayer on a substrate;

forming a first patterned metal layer on the first dielectric interlayer, said patterned metal layer having gaps therein and comprising a first metal feature;

depositing a layer of low dielectric constant material directly on said first patterned metal layer and said first dielectric interlayer, thereby filling the gaps;

treating the exposed upper surface of the layer of low dielectric constant material with a silane ($SiH_4$)-containing plasma to passivate and stabilize said layer of low dielectric constant material, whereby the low dielectric constant is maintained substantially at its as-deposited value during subsequent device processing; and depositing an oxide layer over the plasma treated upper surface of the layer of low dielectric constant material.

2. The method according to claim 1, wherein said layer of low dielectric constant material comprises hydrogen silsesquioxane (HSQ).

3. The method according to claim 2, wherein the oxide layer comprises an oxide deposited under plasma conditions.

4. The method according to claim 3, wherein said oxide layer comprises a silicon oxide layer.

5. The method of claim 4, wherein said silicon oxide is derived from silane ($SiH_4$) in an $N_2O$ atmosphere by plasma enhanced chemical vapor deposition (PECVD).

6. The method of claim 4, wherein said silicon oxide is derived from tetraethylorthosilicate (TEOS) in the presence of oxygen by plasma enhanced chemical vapor deposition (PECVD).

7. The method according to claim 2, wherein said layer of HSQ is deposited at a thickness in the range of from about 3,500 Å to about 5,000 Å.

8. The method according to claim 7, wherein said layer of HSQ is deposited at a thickness of about 4,000 Å.

9. The method according to claim 2, wherein the dielectric constant of the as-deposited HSQ layer is about 2.8 to about 3.2.

10. The method according to claim 9, wherein the dielectric constant of the as-deposited HSQ layer is about 3.0.

11. The method according to claim 2, wherein, in the absence of said plasma treatment, the dielectric constant of said HSQ increases to as high as about 4.0 after said subsequent processing.

12. The method according to claim 1, wherein the substrate comprises a semiconductor substrate.

13. The method according to claim 12, wherein said semiconductor substrate comprises a silicon substrate.

14. The method according to claim 12, wherein said semiconductor substrate comprises at least one active device region.

15. The method according to claim 1, wherein the oxide layer comprises a silicon oxide layer.

16. The method according to claim 15, wherein said silicon oxide layer is deposited under plasma conditions.

17. The method according to claim 16, wherein the silicon oxide layer is derived from tetraethylorthosilicate (TEOS) in the presence of oxygen by plasma enhanced chemical vapor deposition (PECVD).

18. The method according to claim 16, wherein the silicon oxide layer is derived from silane ($SiH_4$) in an $N_2O$ atmosphere by plasma enhanced chemical vapor deposition (PECVD).

19. The method according to claim 1, further comprising:

depositing a second dielectric interlayer over the first patterned metal layer;

forming a through-hole in the second dielectric interlayer exposing a portion of the first metal feature, the low dielectric constant material layer, and the oxide layer;

filling the through-hole with a conductive material to form a borderless via; and forming a second patterned metal layer, having a second metal feature, on the second dielectric interlayer and electrically interconnected to the first metal feature through the borderless via.

* * * * *